(12) United States Patent
Bartlett

(10) Patent No.: US 6,265,946 B1
(45) Date of Patent: Jul. 24, 2001

(54) DIFFERENTIAL MODE CHARGE PUMP AND LOOP FILTER WITH COMMON MODE FEEDBACK

(75) Inventor: Donald M. Bartlett, Fort Collins, CO (US)

(73) Assignee: LSI Logic Corporation, Milpitas, CA (US)

(*) Notice: Subject to any disclaimer, the term of this patent is extended or adjusted under 35 U.S.C. 154(b) by 00 days.

(21) Appl. No.: 09/224,527

(22) Filed: Dec. 31, 1998

(51) Int. Cl.[7] .......................... H03L 7/085; H03L 7/089; H03K 3/00; H03F 3/45
(52) U.S. Cl. .................... 331/17; 331/8; 331/25; 327/111; 327/156; 327/157; 330/258
(58) Field of Search .................. 331/1 A, 8, 14, 331/17, 25; 327/3.5, 7–12, 156–159, 108–112; 330/258

(56) References Cited

U.S. PATENT DOCUMENTS 5,677,648 * 10/1997 Jones ........................... 331/17

* cited by examiner

*Primary Examiner*—David Mis

(57) ABSTRACT

The present invention includes a charge pump that has an advantageous use in a phase-lock loop. The charge pump includes a current mirror, at least two switches and a loop. The current mirror pumps up loop filters according to input signals. The loop senses the common mode of loop filter nodes and compares them to a reference voltage. If the common mode is not at a desired level, then the loop provides leakage paths that are turned on to bring the nodes to that desired level. The use of the current mirror substantially reduces current mismatch. Furthermore, the loop is active for a relatively short time, thus minimizing the introduction of any errors. The present invention reduces static phase error by reducing current mismatch.

10 Claims, 2 Drawing Sheets

DIFFERENTIAL MODE CHARGE PUMP AND LOOP FILTER WITH COMMON MODE FEEDBACK

FIELD OF THE INVENTION

The present invention relates to phase-lock loops and more particularly to reducing static phase errors.

BACKGROUND OF THE INVENTION

A phase-lock loop ("PLL") is typically used to generate an output signal after acquiring the frequency and the phase of a reference clock for purposes of synchronization. Although the frequency of the output signal is ultimately locked onto the frequency of the reference clock, there exists a static phase error between the reference clock and the output signal. FIG. 1 shows a block diagram of a conventional PLL. PLL 100 includes a phase comparator 110 coupled to receive a reference clock from a lead 105. Outputs from phase comparator 110 are provided to a charge pump 120 via leads 115 and 117. An output of charge pump 120 is provided to both a loop filter 130 and a voltage-controlled oscillator ("VCO") 140. An output signal from VCO 140 is provided to a divide by N circuit 150. The output of divide by N circuit 150 is provided as feedback to phase comparator 110. Eventually, the output signal from VCO 140 will have a static phase error relative to the reference clock.

Sources of static phase error are charge injection, loop filter leakage and pump up/down current mismatch. The pump up/down current mismatch can be illustrated by reference to FIG. 2. Circuit 120' is included in charge pump 120 of FIG. 1. Circuit 120' includes a current mirror 200 that includes transistors 210, 220 and a current sink 230. Circuit 120' also includes a current mirror 240 that includes transistors 250, 260 and a current source 270. Current mirrors 200, 240 are coupled to switches 280, 290, respectively. Switches 280, 290 are coupled to charge pump 120 (FIG. 1) via leads 115, 117, respectively. An output is provided at node 285. A loop filter, such as loop filter 130 in FIG. 1, is coupled to node 285.

Accumulated errors can cause the currents of current sink 230 and current source 270 to mismatch. Such errors are caused by process variations, ambient conditions and inherent device characteristics. This mismatch can cause static phase errors and gain error. Thus, a need exists for a charge pump that reduces current mismatch to reduce static phase error. The present invention meets this need.

SUMMARY OF THE INVENTION

The present invention includes a charge pump that has an advantageous use in a phase-lock loop. The charge pump includes a current mirror, at least two switches and a loop. The current mirror pumps up loop filters according to input signals. The loop common mode senses the common mode voltage of the filter nodes and compares them to a reference voltage. If the common mode is not at a desired level, then the loop provides leakage paths that are turned on to bring the nodes to that desired level. The use of the similar device (i.e., p-channel) current mirrors substantially reduces current mismatch when compared to charge pumps using both current sinks and sources. Furthermore, the loop is active for a relatively short time, thus minimizing the introduction of any errors. The present invention reduces static phase error by reducing current mismatch.

Numerous other advantages and features of the present invention will become readily apparent from the following detailed description of the invention and the embodiments thereof, from the claims and from the accompanying drawings in which details of the invention are fully and completely disclosed as a part of this specification.

DETAILED DESCRIPTION OF THE PREFERRED EMBODIMENT

Figure 1:
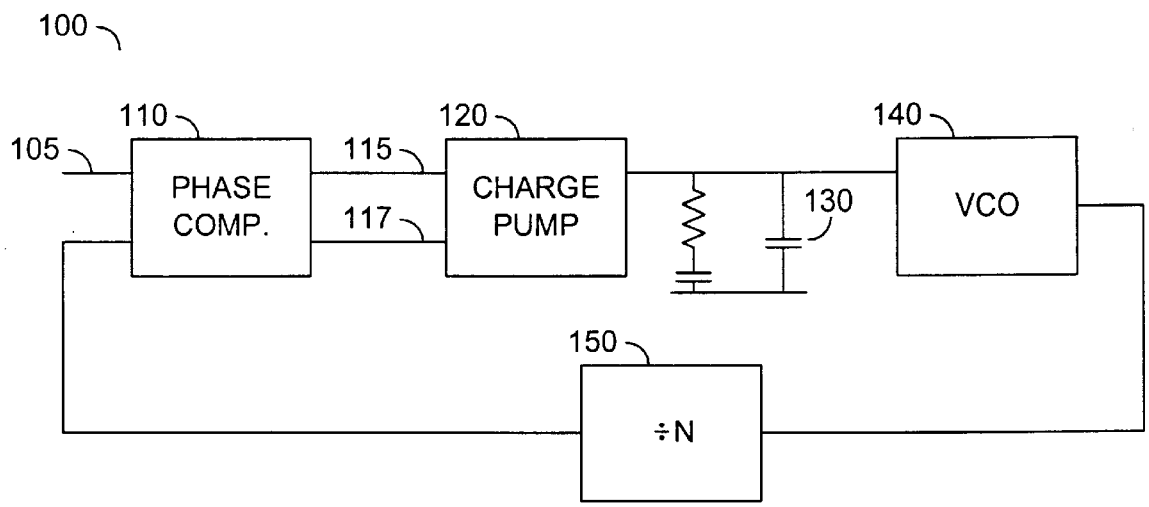
FIG. 1 is a block diagram of a conventional phase-lock loop.

While this invention is susceptible of embodiment in many different forms, there is shown in the drawings and will be described herein in detail a specific embodiment thereof with the understanding that the present disclosure is to be considered as an exemplification of the principles of the invention and is not to be limited to the specific embodiment described.

Figure 3:
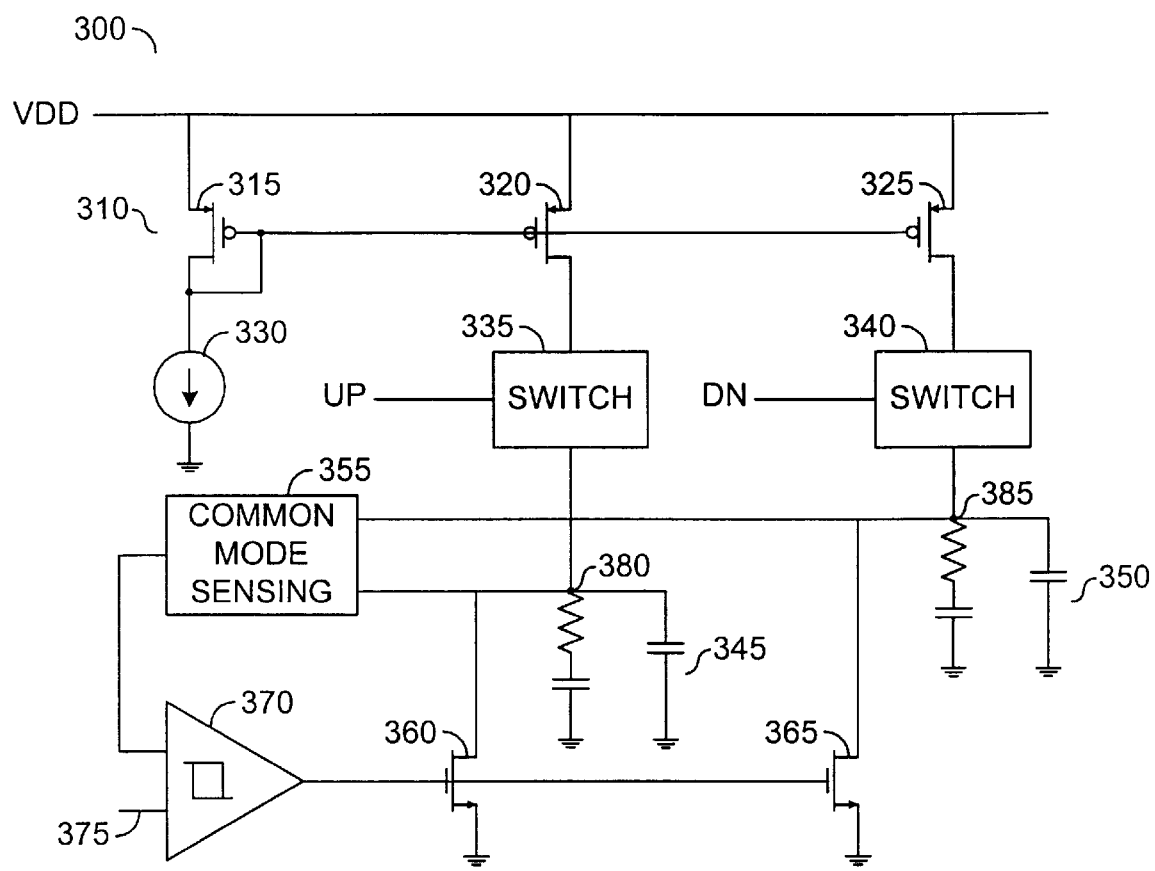
FIG. 3 is a schematic of a charge pump according to the present invention.

FIG. 3 illustrates a charge pump device according to the present invention. Charge pump 300 includes a current source illustrated as a current mirror 310 that includes transistors 315, 320, 325 and current sink 330. Coupled to transistors 320, 325 are switches 335, 340, respectively, which can be transistors. Switches 335, 340 are coupled to a phase comparator, such as comparator 110 in FIG. 1, to receive UP and DN inputs. Further coupled to switches 335, 340 are loop filters 345, 350, respectively. Although filters 345, 350 are shown referenced to ground, filters 345, 350 can be referenced differentially. Furthermore, filters 345, 350 are not included in charge pump 300. Inputs of a common mode sensing circuit 355 are coupled to filters 345, 350. Coupled between the inputs of common mode sensing circuit 355 and ground are transistors 360, 365. A hysterisis comparator 370 is controllingly coupled to the gates of transistors 360, 365. Comparator 370 is coupled to an output of common mode sensing circuit 355, and is coupled to receive reference voltage $V_{ref}$ via a lead 375.

Figure 2:
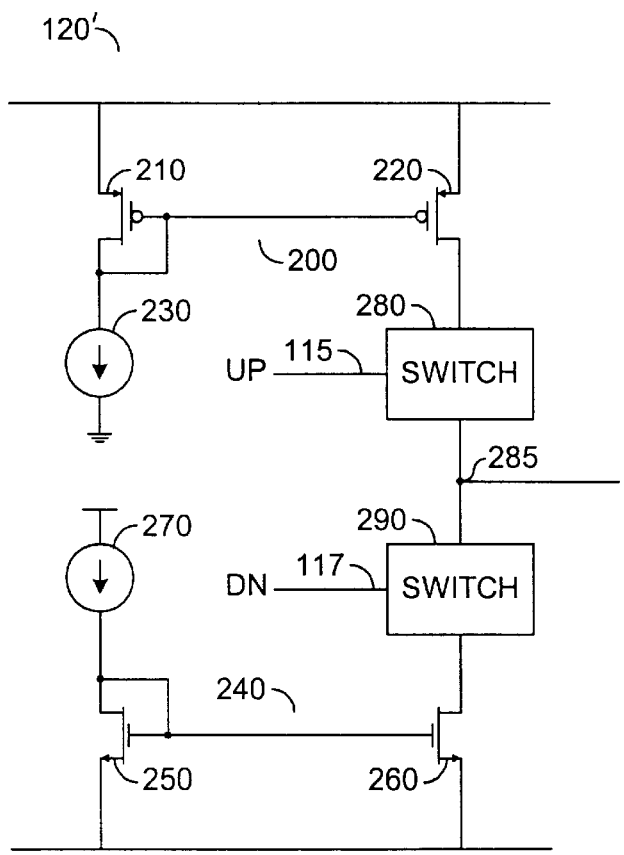
FIG. 2 is a schematic of a portion of the charge pump of the FIG. 1 phase-lock loop.

In operation, instead of switching in a source current for up and a sink current for down as done by the circuit in FIG. 2, the FIG. 3 circuit sources an up current via transistor 320 and sources a down current via transistor 325 into filters 345, 350, respectively. This configuration substantially reduces current mismatch. Both filters 345 and 350 are only charged up by this configuration of charge pump 300. Since the power supply $V_{DD}$ cannot continuously charge filters 345, 350, filters 345, 350 are alternatingly charged responsive to inputs UP and DN.

Common mode sensing circuit 355 senses the common mode at nodes 380, 385 of respective filters 345, 350 and provides an output signal corresponding to the common mode to comparator 370. Comparator 370 compares the common mode signal to the reference voltage $V_{ref}$ and responsively turns on transistors 360, 365 to provide leakage paths from nodes 380, 385 to ground. As a result, both the voltages at nodes 380, 385 will float down. Once the common mode at nodes 380, 385 is within a certain range, comparator 370 turns transistors 360, 365 off. Once again, filters 345, 350 are allowed to alternatingly charge.

The loop formed by common mode sensing circuit 355, comparator 370 and transistors 360, 365 is only active a very low percentage of the overall time of operation. This low percentage is due in part to the hysterisis of comparator 370. If the leakage currents through on transistors 360, 365 do not match, that mismatch has a minimal effect on the static phase error because of the low percentage of time that the loop is active. When the leakage paths are off, the leakage current mismatch has no effect. Once the circuit is stable, the voltages at nodes 380, 385 are not going to change significantly. Accordingly, the circuit shown in FIG. 3 substantially reduces static phase error.

Numerous variations and modifications of the embodiment described above may be effected without departing from the spirit and scope of the novel features of the invention. For example, instead of current mirror 310 that pulls up the voltages at nodes 380, 385, a current mirror can be coupled to those nodes to pull the voltages down. Then, leakage paths similar to those of FIG. 3 can be configured between nodes 380, 385 and the power supply $V_{DD}$ to charge nodes 380, 385 when the voltages at those nodes become too low. It is to be understood that no limitations with respect to the specific device illustrated herein are intended or should be inferred. It is, of course, intended to cover by the appended claims all such modifications as fall within the scope of the claims.

I claim:

1. A charge pump circuit comprising:
   a current source coupled to at least two nodes; and
   a loop that senses a common voltage that corresponds to voltages at the at least two nodes and provides current paths to the at least two nodes responsive to that common voltage.

2. The charge pump circuit of claim 1 wherein the current source is a current mirror.

3. The charge pump circuit of claim 1 wherein the loop includes a common mode sensing circuit.

4. The charge pump circuit of claim 1 wherein the at least two nodes are coupled to loop filters.

5. The charge pump circuit of claim 1 further comprising at least two switches that responsively couple the current source to the at least two nodes.

6. A phase-lock loop circuit comprising:
   at least two filters;
   at least two switches coupled to the at least two filters;
   a current source coupled to the at least two filters; and
   a loop coupled to the at least two filters, wherein the loop senses the common mode of the at least two filters and provides a leakage path to the at least two filters when the common mode is not a desired value.

7. The phase-lock loop circuit of claim 6 wherein the current source is a current mirror.

8. A charge pump circuit comprising:
   means for providing matched currents;
   means for sensing a common mode of at least two nodes and for leaking current when the common mode is not a desired value; and
   means for coupling the means for providing matched currents to the at least two nodes.

9. The circuit of claim 8 wherein the means for providing matched currents is a current mirror.

10. The circuit of claim 8 wherein the means for sensing includes a common mode sensing circuit.

* * * * *